(12) United States Patent
Ishizuka

(10) Patent No.: US 6,798,145 B2
(45) Date of Patent: Sep. 28, 2004

(54) ELECTROLUMINESCENCE DISPLAY UNIT

(75) Inventor: Shinichi Ishizuka, Tsurugashima (JP)

(73) Assignee: Pioneer Corporation, Tokyo (JP)

(*) Notice: Subject to any disclaimer, the term of this patent is extended or adjusted under 35 U.S.C. 154(b) by 0 days.

(21) Appl. No.: 10/242,766

(22) Filed: Sep. 13, 2002

(65) Prior Publication Data

US 2003/0052618 A1 Mar. 20, 2003

(30) Foreign Application Priority Data

Sep. 17, 2001 (JP) ........................................ 2001-281714

(51) Int. Cl.[7] .............................................. H05B 37/00
(52) U.S. Cl. ................................ 315/169.1; 315/169.3; 345/92
(58) Field of Search ........................... 315/169.1, 169.3, 315/169.4; 257/71, 72; 345/84, 77, 92

(56) References Cited

U.S. PATENT DOCUMENTS 6,576,924 B1 * 6/2003 Yamazaki et al. ............ 257/59
6,587,086 B1 * 7/2003 Koyama ....................... 345/77

* cited by examiner

Primary Examiner—James Vannucci
Assistant Examiner—Jimmy T. Vu
(74) Attorney, Agent, or Firm—Morgan, Lewis & Bockius LLP

(57) ABSTRACT

An EL display unit which can realize an appropriate image display corresponding to an input video signal in a simple structure. N driving transistors individually supplying drive currents to N electroluminescence elements respectively. The driving transistors have channel widths and/or channel lengths to generate the drive currents in a ratio in which each of the N electroluminescence elements is driven to emit light at a desired intensity.

21 Claims, 4 Drawing Sheets

ELECTROLUMINESCENCE DISPLAY UNIT

BACKGROUND OF THE INVENTION

1. Field of the Invention

The present invention relates to an organic electroluminescence unit which serves as pixels in an active matrix display panel.

2. Description of the Related Art

At present, an electroluminescence element (hereinafter referred to as "EL element") using an organic material and the like for a light emitting layer, for example, is known as a light emitting element for use in a display panel. The EL element can be equivalently represented by a capacitive component, and a component of diode characteristic connected in parallel with the capacitive component. As a DC voltage is applied between electrodes of the EL element, a charge is accumulated on the capacitive component, and a drive current begins to flow as the accumulated charge exceeds a light emission threshold voltage. This causes the EL element to emit light at an intensity proportional to the drive current.

The EL elements include a red light emitting EL element having a structure for emitting light in red; a green light emitting EL element having a structure for emitting light in green; and a blue light emitting EL element having a structure for emitting light in blue. Thus, these three types of EL elements, emitting light in red, blue and green, form a single EL display unit serving as a pixel, and a number of EL display units are arranged in matrix on a panel which defines one screen, to thereby constitute a color display panel.

However, the red light emitting EL element, green light emitting EL element, and blue light emitting EL element are different from one another in the intensity of light emitted therefrom with respect to a constant (or same) drive current. Therefore, in order to provide an appropriately displayed image corresponding to an input video signal, level adjustments must be made, for example, for each of red, green and blue components at the stage of this input video signal, or different voltages must be applied to the EL elements for respective colors of emitted light, thus giving rise to a problem of a complicated configuration.

SUMMARY OF THE INVENTION

An object of the present invention is to provide an EL display unit which is capable: of realizing an appropriate image display corresponding to an input video signal in a simple configuration.

According to one aspect of the present invention, there is provided an electroluminescence display unit including a plurality of electroluminescence elements for emitting light in different colors respectively, and a plurality of driving transistors associated with the electroluminescence elements respectively for generating drive currents to cause the electroluminescence elements to emit light respectively, wherein the driving transistors have channel widths decided to generate the drive currents in a certain ratio, with which currents the electroluminescence elements emit light at desired intensities respectively.

When three colors of light, namely red, green and blue, are concerned, each of the electroluminescence elements serving to emit red, green or blue light can be driven to emit light at a desired intensity, using a single power supply voltage. It is therefore possible to achieve an appropriate image display corresponding to an input video signal in a display device having a simple structure. Such electroluminescence display unit needs neither a circuit for adjusting the level of the input video signal for each color component, nor a power supply circuit for generating different power supply voltages for the respective colors.

The driving transistors may have channel lengths, instead of the channel widths, to generate the drive currents in the predetermined ratio, with which currents the electroluminescence elements emit light at the desired intensities respectively.

DETAILED DESCRIPTION OF THE INVENTION

Embodiments of the present invention will be described in detail with reference to the drawings.

Figure 1:
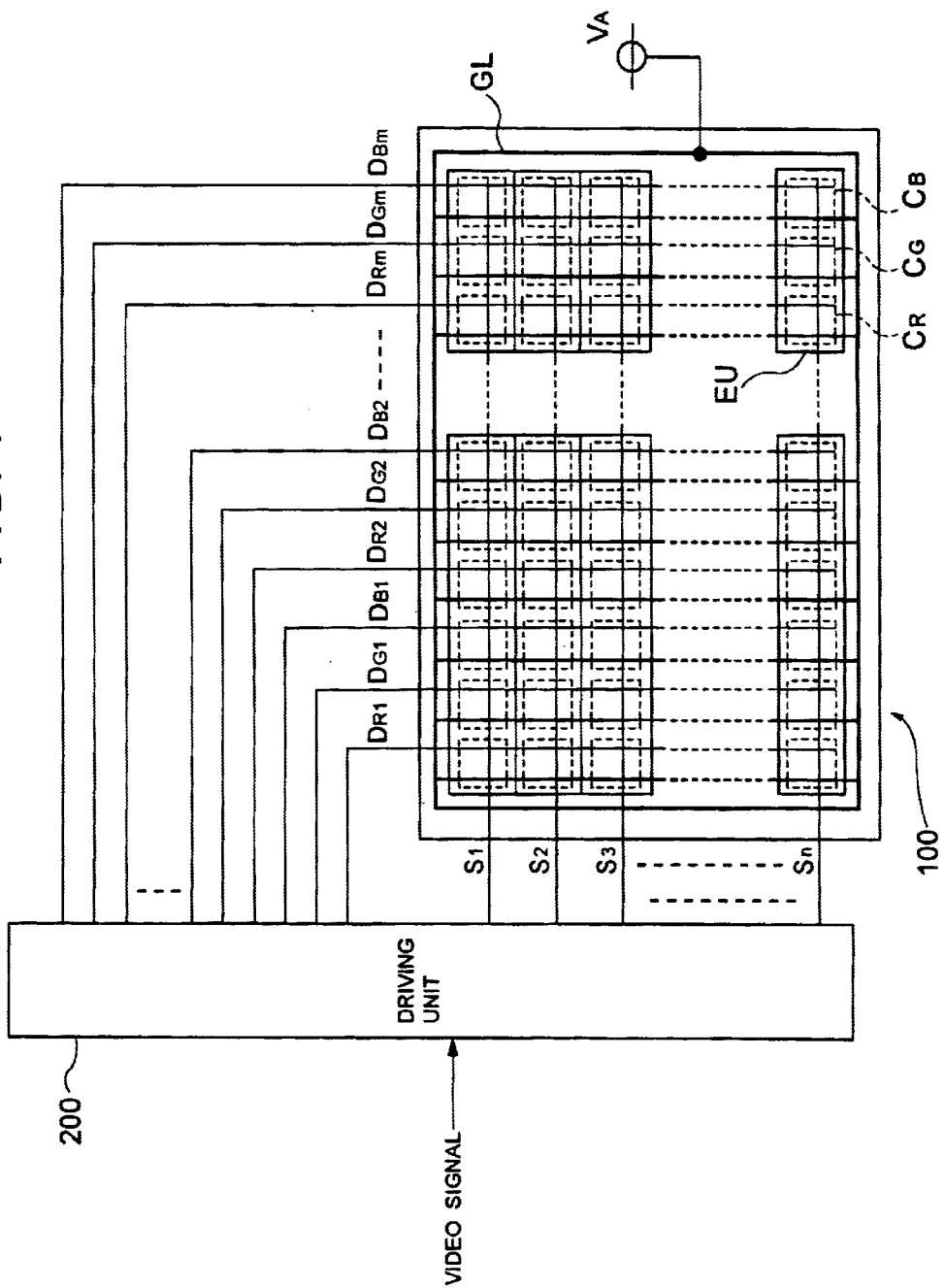
FIG. 1 is a diagram generally illustrating the configuration of a display device which is equipped with a color display panel including a number of EL display units, according to the present invention, arranged in matrix.

Referring to FIG. 1, illustrated is a schematic structure of a display device which is equipped with a color display panel 100. In the color display panel 100, a number of EL display units EU, according to the present invention, are arranged in matrix.

The color display panel 100 is formed with scanning lines $S_1$–$S_n$ which serve as n horizontal scanning lines on one screen, respectively; m red driving data lines $D_{R1}$–$D_{Rm}$, m green driving data lines $D_{G1}$–$D_{Gm}$, and m blue driving data lines $D_{B1}$–$D_{Bm}$, arranged to intersect with the respective scanning lines. The color display panel 100 is further provided with a power supply bus line GL which is applied with a power supply voltage $V_A$ for light emission. The EL display unit EU, which functions as each pixel on the color display panel 100, includes a red light emission cell $C_R$ which emits light in red; a green light emission cell $C_G$ which emits light in green; and a blue light emission cell $C_B$ which emits light in blue. The red light emission cell $C_R$ is formed at an intersection of each scanning line S with each red driving data line $D_R$. The green light emission cell $C_G$ is formed at an intersection of each scanning line S with each green driving data line $D_G$. The blue light emission cell $C_B$ is formed at an intersection of each scanning line S and each blue driving data line $D_B$. Each of the red light emission cell $C_R$, green light emission cell $C_G$, and blue light emission cell $C_B$ is supplied with the power supply voltage $V_A$ through the power supply bus line GL.

A driving unit 200 generates a scanning pulse having a predetermined voltage in accordance with an input video signal, and sequentially applies the scanning pulse to the respective scanning lines $S_1$–$S_n$ of the color display panel 100. Meanwhile, the driving unit 200 further generates a data voltage corresponding to a luminance level represented by the input video signal, and sequentially applies the data voltage to the respective red driving data lines $D_{R1}$–$D_{Rm}$, green driving data lines $D_{G1}$–$D_{Gm}$, and blue driving data lines $D_{B1}$–$D_{Bm}$ for every horizontal scanning line. Each of the red light emission cells $C_R$, green light emission cells $C_G$, and blue light emission cells $C_B$ formed within the EL display unit EU fetches the data voltage applied to the associated driving data line D in response to a scanning pulse applied to the associated scanning line S to emit light at a luminance corresponding to the data voltage.

Figure 2:
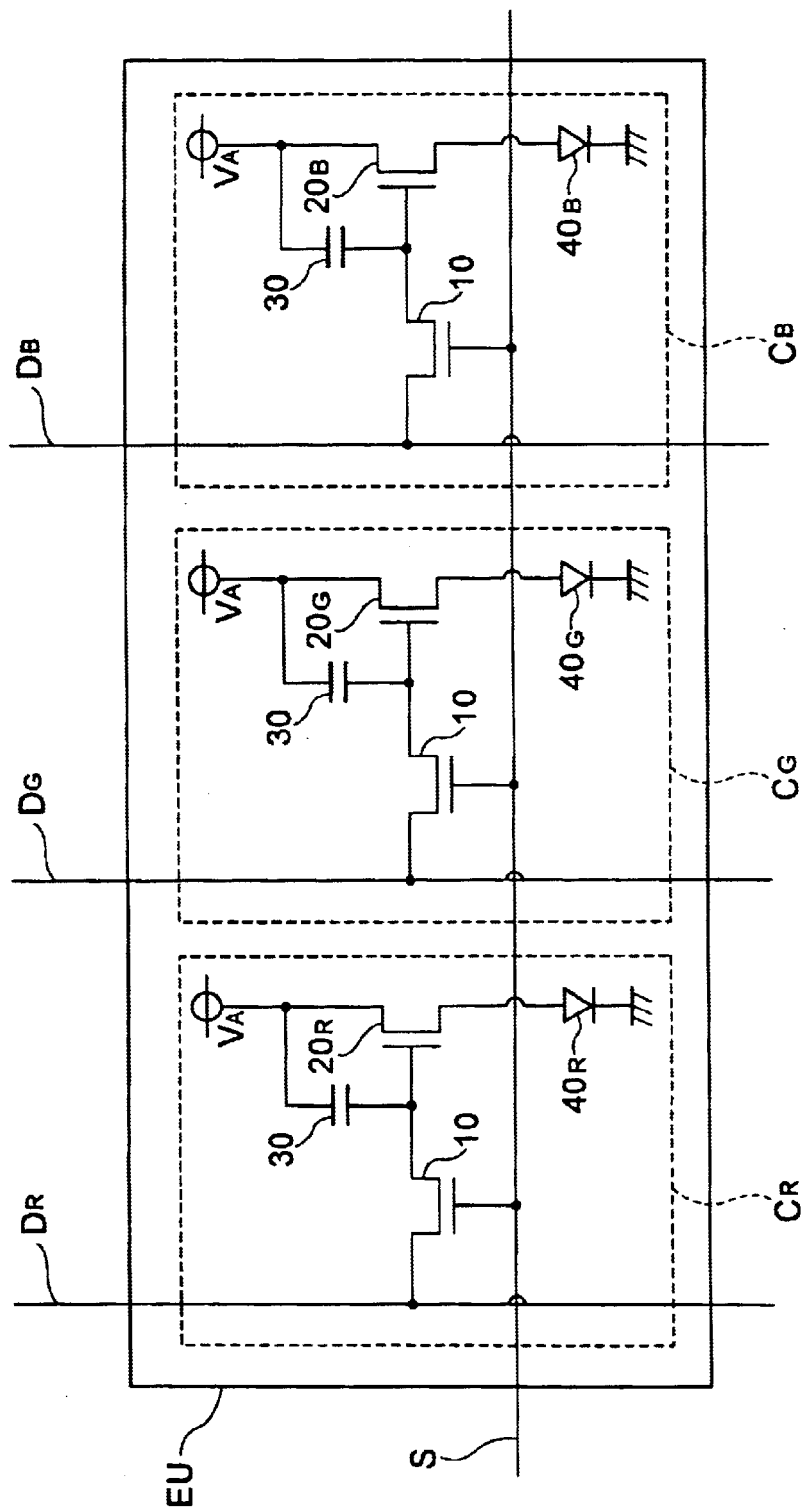
FIG. 2 is a diagram illustrating an electric circuit for each of a red light emission cell, a green light emission cell, and a blue light emission cell formed in one EL display unit.

FIG. 2 is a diagram illustrating an electric circuit of the respective red light emission cell $C_R$, green light emission cell $C_G$, and blue light emission cell $C_B$ formed within the EL display unit EU.

Specifically, each of the red light emission cell $C_R$, green light emission cell $C_G$, and blue light emission cell $C_B$ includes an FET (Field Effect Transistor) 10 for scanning line selection, and a capacitor 30. The red light emission cell $C_R$ is further provided with an FET $20_R$ as a driving transistor, and an organic EL element $40_R$ for emitting light in red. Likewise, the green light emission cell $C_G$ is provided with an FET $20_G$ as a driving transistor, and an organic EL element $40_G$ for emitting light in green. The blue light emission cell $C_B$ is provided with an FET $20_B$ as a driving transistor, and an organic EL element $40_B$ for emitting light in blue.

The FET 10 has a gate terminal connected to a scanning line S, and a drain terminal connected to a data line D ($D_R$, $D_G$, or $D_B$). The source terminal of the FET 10, gate terminal of the FET 20 ($20_R$, $20_G$, or $20_B$), and one terminal of the capacitor 30 are mutually connected. The power supply voltage $V_A$ is applied to a source terminal of the FET 20 ($20_R$, $20_G$, or $20_B$), and the capacitor 30 is connected between the gate terminal and drain terminal of the FET 20 ($20_R$, $20_G$, or $20_B$). Further, the drain terminal of the FET 20 ($20_R$, $20_G$, or $20_B$) is connected to an anode terminal of the organic EL element 40 ($40_R$, $40_G$, or $40_B$). The organic EL element 40 ($40_R$, $40_G$, or $40_B$) has a cathode terminal connected to a potential 0.

The following description will focus on the operation of the red light emission cell $C_R$, green light emission cell $C_G$, and blue light emission cell $C_B$, which have the circuit configuration as described above.

The FET 10 turns on in response to a scanning pulse supplied through the scanning line S to apply the gate terminal of the FET 20 ($20_R$, $20_G$, or $20_B$) and the capacitor 30 with a voltage based on a data voltage supplied through the data line D ($D_R$, $D_G$, or $D_B$). The FET 20 ($20_R$, $20_G$, or $20_B$) turns on in response to the voltage applied thereto, based on the data voltage, and supplies the organic EL element 40 ($40_R$, $40_G$, or $40_B$) with a drive current based on a voltage which is calculated by subtracting the data voltage from the power supply voltage $V_A$ (i.e., power supply voltage $V_A$ minus data voltage). The organic EL element 40 ($40_R$, $40_G$, or $40_B$) emits light in response to the drive current. Specifically, the organic EL element $40_R$ emits light in red; the organic EL element $40_G$ emits light in green; and the organic EL element $40_B$ emits light in blue. Meanwhile, the capacitor 30 is charged by the voltage applied thereto, based on the data voltage, and a voltage in accordance with the data voltage is held on the capacitor 30 by this charging operation. When the supply of the scanning pulse is stopped, the FET 10 turns off to stop supplying the data voltage to the gate terminal of the FET 20 ($20_R$, $20_G$, or $20_B$). However, the FET 20 ($20_R$, $20_G$, or $20_B$) is still applied at the gate terminal with the voltage held on the capacitor 30, so that the FET 20 remains on to continuously supply the drive current to the organic EL element 40 ($40_R$, $40_G$, or $40_B$). In other words, the organic EL element 40 ($40_R$, $40_G$, or $40_B$) continues the light emission even after the supply of the scanning pulse is stopped. The organic EL element $40_R$ for emitting light in red, the organic EL element $40_G$ for emitting light in green, and the organic EL element $40_B$ for emitting light in blue are often different from one another in the intensity of light emitted therefrom in response to the same drive current supplied thereto. Further, the organic EL elements $40_R$, $40_G$ and $40_B$ are often different from one another in required intensity of light to be emitted therefrom, so that the organic EL elements $40_R$, $40_G$, $40_B$ should often be applied with different drive currents.

Figure 3:
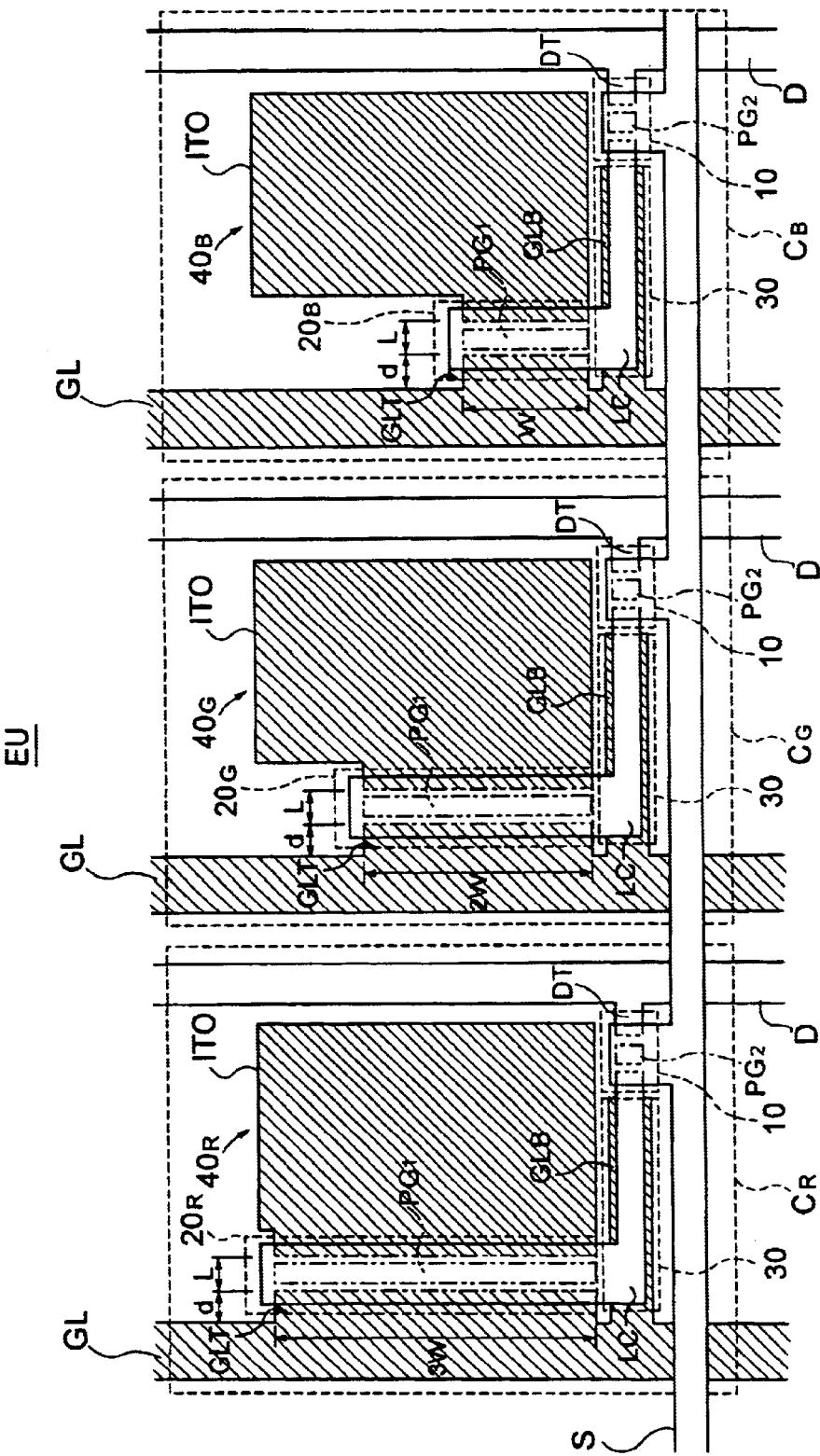
FIG. 3 is a diagram illustrating an example of the internal configuration of the EL display unit EU.

To address this situation, the present embodiment employs the FET $20_R$, $20_G$, and $20_B$ having different channel widths (or channel lengths) from one another, as described below. The FET $20_R$, $20_G$, and $20_B$ supply the drive currents to the organic EL elements $40_R$, $40_G$, $40_B$, respectively, FIG. 3 illustrates the structure of the EL display unit EU viewed from the front surface of the color display panel 100. The example illustrated in FIG. 3 shows a structure which is utilized when the ratio of drive currents respectively supplied to the organic EL elements $40_R$, $40_G$, $40_B$ is:

$$I_R:I_G:I_B=3:2:1$$

when each of the organic EL elements $40_R$, $40_G$, $40_B$ is driven to emit light at a desired intensity.

It should be noted that the example illustrated in FIG. 3 only shows the placement (arrangement) of electrodes formed within the EL display unit EU, and does not show p-type (or n-type) diffusion regions, insulating films, and the organic EL layers which form the heart of the organic EL element 40.

Inside a region of each of the red light emission cell $C_R$, green light emission cell $C_G$, and blue light emission cell $C_B$ in the EL display unit EU, a power supply bus line GL and the data line D ($D_R$, $D_G$, or $D_B$) extend in parallel to each other and intersect with the scanning line S over an insulating film. In each cell region, the power supply bus line GL has a branch GLB extending in a direction along the scanning line S, and a protrusion GLT having a height d. Also, in each cell region, the data line D ($D_R$, $D_G$, or $D_B$) has a protrusion DT formed at a position corresponding (opposed) to the branch GLB of the power supply bus line GL. In each cell region, the organic EL element 40 ($40_R$, $40_G$, or $40_B$) is formed. On one side of a transparent electrode ITO, which is an electrode at one end of the organic EL element 40, a p-type (or n-type) diffusion region is formed extending in a direction along this side. In the protrusion GLT of the power supply bus line GL, a p-type (or n-type) diffusion region is formed extending in a direction along the protrusion GLT. An n-type (or p-type) diffusion region is formed between the p-type (or n-type) diffusion region formed on the one side of the transparent electrode ITO and the p-type (or n-type) diffusion region formed in the protrusion GLT. An insulating film is formed on the top surfaces of these diffusion regions, and a strip polysilicon gate $PG_1$, extending in a direction along the one side of the transparent electrode ITO, is formed within the insulating film at a position over the n-type (or p-type) diffusion region. Further, an electrode LC in L-shape as shown in FIG. 3 is formed above the polysilicon gate $PG_1$ and the branch GLB of the power supply bus line GL. The electrode LC is electrically connected to the polysilicon gate $PG_1$. An insulating film is also formed between the electrode LC and branch GLB. A region in which the electrode LC overlaps with the branch GLB constitutes the capacitor 30. P-type (or n-type) diffusion regions are formed in the protrusion DT of the data line D ($D_R$, $D_G$, or $D_B$) and at one end of the electrode LC existing at a position opposite to the protrusion DT, respectively. An n-type (or p-type) diffusion region is formed between these p-type (or n-type) diffusion regions. An insulating film is formed on the top surfaces of these diffusion regions, and a polysilicon gate $PG_2$ is buried in the insulating film. The polysilicon gate $PG_2$ is electrically connected to the scanning line S. As illustrated in FIG. 3, a region including the protrusion DT of the data line D ($D_R$, $D_G$, or $D_B$) and the one end of the electrode LC constitutes the FET 10 for scanning line selection.

Also, as illustrated in FIG. 3, a region including the protrusion GLT of the power supply bus line GL and one side of the transparent electrode ITO constitutes the FET 20 as a driving transistor. Therefore, the channel of the FET 20 is formed between the protrusion GLT and the one side of the transparent electrode ITO, as illustrated in FIG. 3. The spacing L between the protrusion GLT and the one side of the transparent electrode ITO defines the channel length of the FET 20, and the width (W, 2W, or 3W) of the protrusion GLT defines the channel width of the FET 20.

Specifically, the FET $20_G$ for supplying a drive current to the organic EL element $40_G$ of the green light emission cell $C_G$ has the channel width (2W) twice the channel width (W) of the FET $20_B$ for supplying a drive current to the organic EL element $40_B$ of the blue light emission cell $C_B$. Further, the FET $20_R$ for supplying a drive current to the organic EL element $40_R$ of the red light emission cell $C_R$ has the channel width (3W) three times the channel width (W) of the FET $20_B$. With the different channel widths, when the same voltage is supplied as a gate-source voltage supplied to the respective FETs, a drive current $I_G$ supplied to the organic EL element $40_G$ for emitting green light is "2," and a drive current $I_R$ supplied to the organic EL element $40_R$ for emitting red light is "3" when a drive current $I_B$ supplied to the organic EL element $40_B$ for emitting blue light is "1." As described above, the respective organic EL elements $40_R$, $40_G$ and $40_B$ should be supplied with the drive currents in the following ratio for driving each of the organic EL elements $40_R$, $40_G$ and $40_B$ to emit light at a desired intensity:

$$I_R:I_G:I_B=3:2:1$$

By employing this ratio, the organic EL element $40_R$ serving to emit red light, the organic EL element $40_G$ serving to emit green light, and the organic EL element $40_B$ serving to emit blue light within the EL display unit EU having the structure as illustrated in FIG. 3, each emit light at a desired intensity.

As understood from the above, in the embodiment illustrated in FIG. 3, the driving transistors (FETs $20_R$, $20_G$, $20_B$) for the respective colors are provided with different channel widths from one another in order to output (produce) the different drive currents for driving the organic EL elements ($40_R$, $40_G$, $40_B$) at desired intensities respectively.

A current $I_{ds}$ flowing between the drain and source of an FET is expressed by:

$$I_{ds}=(\mu \cdot C_{OX}/2) \cdot (W/L) \cdot (V_{gs}-V_{th})$$

where $\mu$: Carrier Mobility;
$C_{OX}$: Gate Capacitance per Unit Area:
W: Channel Width;
L: Channel Length;
$V_{gs}$: Gate-Source Voltage; and
$V_{th}$: Threshold Therefore, it is also possible to generate the drive currents for driving each of the organic EL elements $40_R$, $40_G$, and $40_B$ at a desired intensity when the respective driving transistors (FETs $20_R$, $20_G$, $20_B$) are formed with different channel lengths L instead of the channel widths W.

Figure 4:
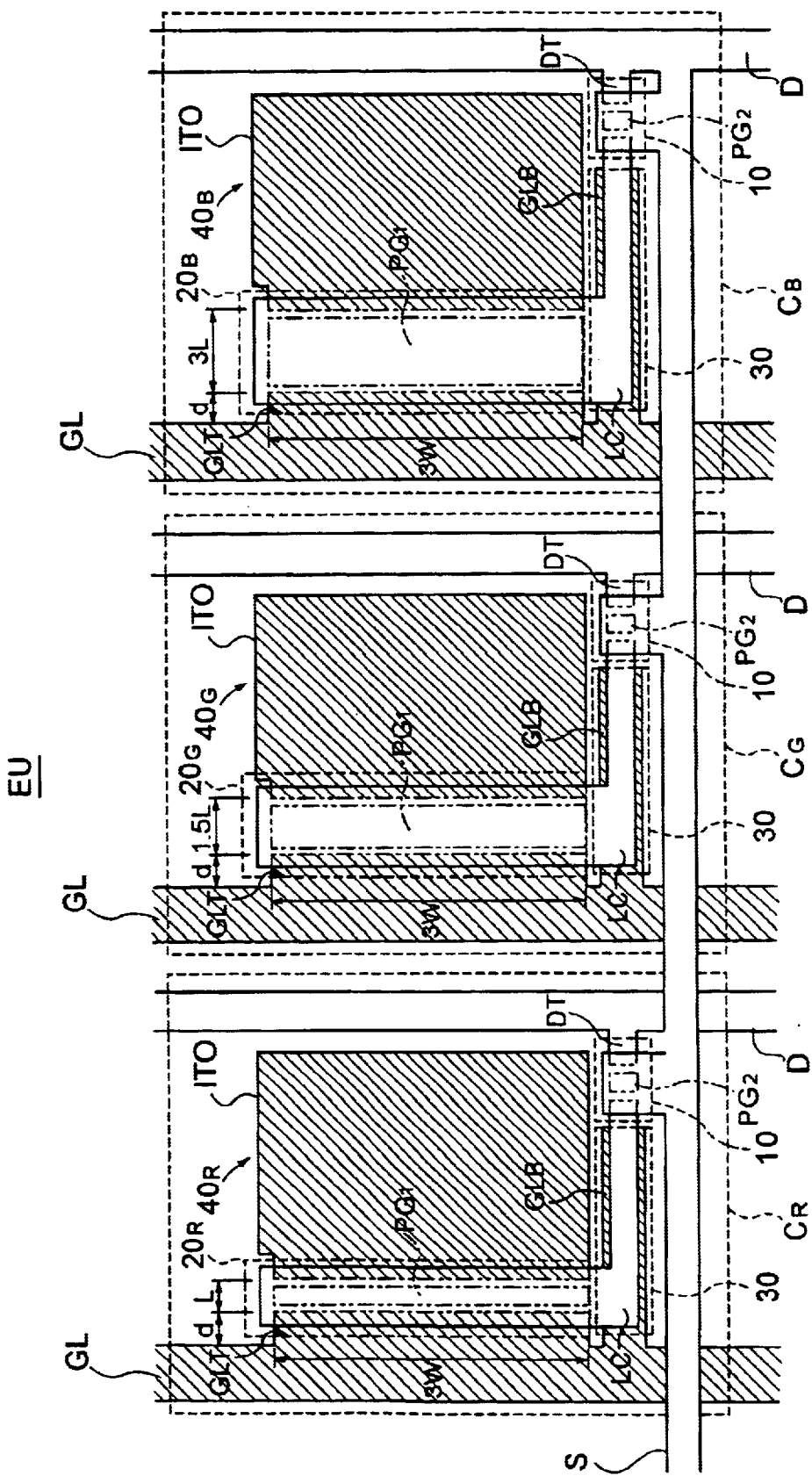
FIG. 4 is a diagram illustrating another example of the internal configuration of the EL display unit EU according to an alternative embodiment.

FIG. 4 is a diagram illustrating another example of the structure of the EL display unit EU which is made in view of the just mentioned aspect.

Similar to FIG. 3, the example illustrated in FIG. 4 has a structure which is used when the ratio of drive currents respectively supplied to the organic EL elements $40_R$, $40_G$, $40_B$ is:

$$I_R:I_G:I_B=3:2:1$$

in order to cause each of the organic EL elements $40_R$, $40_G$, $40_B$ to emit light at a desired intensity.

In the EL display unit EU illustrated in FIG. 4, the FET $20_G$ for supplying a drive current to the organic EL element $40_G$ of the green light emission cell $C_G$ has the channel length (1.5L) 1.5 times the channel length (L) of the FET $20_R$ for supplying a drive current to the organic EL element $40_R$ of the red light emission cell $C_R$. Further, the FET $20_B$ for supplying a drive current to the organic EL element $40_B$ of the blue light emission cell $C_B$ has the channel length (3L) three times the channel length (L) of the FET $20_R$. With the different channel lengths, the organic EL element $40_G$ for emitting green light is supplied with the drive current $I_G$ twice the drive current $I_B$ supplied to the organic EL element $40_B$ for emitting blue light, and the organic EL element $40_R$ is supplied with the drive current $I_R$ three times the drive current $I_B$. Thus, as is the case with the EL display unit EU which employs the structure illustrated in FIG. 3, the red light emission cell $C_R$, green light emission cell $C_G$, and blue light emission cell $C_B$ each emit light at a desired intensity.

In the foregoing embodiments, the driving transistors (FETs $20_R$, $20_G$, $20_B$) are all formed with different channel widths (or channel lengths) from one another for the respective red, green and blue colors. However, all the transistors need not have different channel widths (or channel lengths). Also, in the foregoing embodiments, each of the driving transistors (FETs $20_R$, $20_G$, $20_B$) has one of the channel width and channel length different from those of the remaining transistors. However, each transistor may have both a different channel width and a different channel length.

In essence, the channel width and/or channel length are individually set for each of the driving transistors for the respective colors such that the drive currents for emission of red, green and blue light are generated in a particular ratio with which the EL elements can emit red, green and blue light at desired intensities respectively.

This application is based on a Japanese patent application No. 2001-281714 and the entire disclosure thereof is incorporated herein by reference.

What is claimed is:

1. An electroluminescence display unit comprising:
   a plurality of electroluminescence elements for emitting light in different colors; and
   a plurality of driving transistors associated with said plurality of electroluminescence elements respectively for generating a plurality of drive currents to cause said electroluminescence elements to emit light respectively, wherein said plurality of driving transistors have channel widths to generate said plurality of drive currents in a predetermined ratio, such that said plurality of drive currents drive said plurality of electroluminescence elements to emit light at desired intensities that respectively correspond to a color.

2. The electroluminescence display unit according to claim 1, wherein each of said plurality of driving transistors is supplied with equal voltage.

3. The electroluminescence display unit according to claim 1, wherein said plurality of driving transistors are supplied with a voltage from a single power source.

4. The electroluminescence display unit according to claim 1, wherein said plurality of electroluminescence elements are a red electroluminescence element for emitting red light, a green electroluminescence element for emitting green light and a blue electroluminescence element for emitting blue light;
said plurality of driving transistors are a red driving transistor for generating a red drive current for driving said red electroluminescence element to emit light, a green driving transistor for generating a green drive current for driving said green electroluminescence element to emit light, and a blue driving transistor for generating a blue drive current for driving said blue electroluminescence element to emit light; and
said red driving transistor, said green driving transistor, and said blue driving transistor have the channel widths to generate said red drive current, said green drive current, and said blue drive current in the predetermined ratio such that said red electroluminescence element, said green electroluminescence element, and said blue electroluminescence element emit light at the desired intensities respectively.

5. The electroluminescence display unit according to claim 4, wherein said red driving transistor, said green driving transistor, and said blue driving transistor are supplied with equal voltage.

6. The electroluminescence display unit according to claim 4, wherein the channel width of said red driving transistor, the channel width of said green driving transistor, and the channel width of said blue driving transistor are different from one another.

7. The electroluminescence display unit according to claim 4, wherein one of the channel width of said red driving transistor, the channel width of said green driving transistor, and the channel width of said blue driving transistor is different from the channel width of the other driving transistors.

8. An electroluminescence display unit comprising:
a plurality of electroluminescence elements for emitting light in different colors; and
a plurality of driving transistors associated with said plurality of electroluminescence elements respectively for generating a plurality of drive currents to cause said electroluminescence elements to emit light respectively, wherein said plurality of driving transistors have channel lengths to generate said plurality of drive currents in a predetermined ratio, such that said plurality of drive currents: drive said plurality of electroluminescence elements to emit light at desired intensities that respectively correspond to a color.

9. The electroluminescence display unit according to claim 8, wherein each of said plurality of driving transistors is supplied with equal voltage.

10. The electroluminescence display unit according to claim 8, wherein said plurality of driving transistors are supplied with a voltage from a single power source.

11. The electroluminescence display unit according to claim 8, wherein said plurality of electroluminescence elements are a red electroluminescence element for emitting red light, a green electroluminescence element for emitting green light and a blue electroluminescence element for emitting blue light;
said plurality of driving transistors are a red driving transistor for generating a red drive current for driving said red electroluminescence element to emit light, a green driving transistor for generating a green drive current for driving said green electroluminescence element to emit light, and a blue driving transistor for generating a blue drive current for driving said blue electroluminescence element to emit light; and
said red driving transistor, said green driving transistor, and said blue driving transistor have the channel lengths to generate said red drive current, said green drive current, and said blue drive current in the predetermined ratio such that said red electroluminescence element, said green electroluminescence element, and said blue electroluminescence element emit light at the desired intensities respectively.

12. The electroluminescence display unit according to claim 11, wherein said red driving transistor, said green driving transistor, and said blue driving transistor are supplied with equal voltage.

13. The electroluminescence display unit according to claim 11, wherein the channel length of said red driving transistor, the channel length of said green driving transistor, and the channel length of said blue driving transistor are different from one another.

14. The electroluminescence display unit according to claim 11, wherein one of the channel length of said red driving transistor, the channel length of said green driving transistor, and the channel length of said blue driving transistor is different from the channel length of the other driving transistors.

15. An electroluminescence display unit comprising:
a plurality of electroluminescence elements for emitting light in different colors; and
a plurality of driving transistors associated with said plurality of electroluminescence elements respectively for generating a plurality of drive currents to cause said electroluminescence elements to emit light respectively, wherein said plurality of driving transistors have channel widths and channel lengths to generate said plurality of drive currents in a predetermined ratio, such that said plurality of drive currents drive said plurality of electroluminescence elements to emit light at desired intensities that respectively correspond to a color.

16. The electroluminescence display unit according to claim 15, wherein each of said plurality of driving transistors is supplied with equal voltage.

17. The electroluminescence display unit according to claim 15, wherein said plurality of driving transistors are supplied with a voltage from a single power source.

18. The electroluminescence display unit according to claim 15, wherein said plurality of electroluminescence elements are a red electroluminescence element for emitting red light, a green electroluminescence element for emitting green light and a blue electroluminescence element for emitting blue light;
said plurality of driving transistors are a red driving transistor for generating a red drive current for driving said red electroluminescence element to emit light, a green driving transistor for generating a green drive current for driving said green electroluminescence element to emit light, and a blue driving transistor for generating a blue drive current for driving said blue electroluminescence element to emit light; and
said red driving transistor, said green driving transistor, and said blue driving transistor have the channel widths and channel lengths to generate said red drive current, said green drive current, and said blue drive current in the predetermined ratio such that said red electroluminescence element, said green electroluminescence element, and said blue electroluminescence element emit light at the desired intensities respectively.

19. The electroluminescence display unit according to claim 18, wherein said red driving transistor, said green driving transistor, and said blue driving transistor are supplied with equal voltage.

20. The electroluminescence display unit according to claim 18, wherein the channel width and channel length of said red driving transistor, the channel width and channel of said green driving transistor, and the channel width and channel length of said blue driving transistor are different from one another.

21. The electroluminescence display unit according to claim 18, wherein two of the channel width and channel length of said red driving transistor, the channel width and channel length of said green driving transistor, and the channel width and channel length of said blue driving transistor are equal to each other.

* * * * *